United States Patent
Claridge et al.

(10) Patent No.: US 11,031,268 B2
(45) Date of Patent: Jun. 8, 2021

(54) DEVICE FOR IN SITU THERMAL CONTROL AND TRANSFER OF A MONOLAYER OR THIN FILM

(71) Applicant: Purdue Research Foundation, West Lafayette, IN (US)

(72) Inventors: Shelley A. Claridge, Lafayette, IN (US); Tyler Hayes, Lafayette, IN (US); David McMillan, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 369 days.

(21) Appl. No.: 16/038,232

(22) Filed: Jul. 18, 2018

(65) Prior Publication Data

US 2019/0027387 A1    Jan. 24, 2019

Related U.S. Application Data

(60) Provisional application No. 62/533,689, filed on Jul. 18, 2017.

(51) Int. Cl.
| | |
|---|---|
| *B05C 13/02* | (2006.01) |
| *B05D 1/20* | (2006.01) |
| *H01L 21/677* | (2006.01) |
| *H01L 51/00* | (2006.01) |
| *B05C 3/10* | (2006.01) |
| *B05C 11/02* | (2006.01) |
| *B05D 1/18* | (2006.01) |

(52) U.S. Cl.
CPC .......... *H01L 21/67709* (2013.01); *B05C 3/10* (2013.01); *B05C 11/02* (2013.01); *B05C 13/02* (2013.01); *B05D 1/204* (2013.01); *B05D 1/208* (2013.01); *H01L 51/0026* (2013.01); *H01L 51/0075* (2013.01); *B05D 1/18* (2013.01)

(58) Field of Classification Search
USPC ........................................ 118/402, 52, 612
See application file for complete search history.

(56) References Cited

U.S. PATENT DOCUMENTS

| | | | |
|---|---|---|---|
| 2003/0157371 A1* | 8/2003 | Ihara ...................... | G11B 5/845 428/842.2 |
| 2004/0137220 A1* | 7/2004 | Tsuchiya .................. | G11B 5/84 428/328 |
| 2017/0050212 A1* | 2/2017 | Lu ............................ | B05D 7/54 |
| 2017/0125924 A1* | 5/2017 | Lalitha ................. | B23K 1/0016 |

OTHER PUBLICATIONS

Mann, J. et al., "Noncovalent Functionalization of Graphene by Molecular and Polymeric Adsorbates", J. Phys. Chem. Lett. 2013, 4, pp. 2649-2657.

(Continued)

*Primary Examiner* — Yewebdar T Tadesse
(74) *Attorney, Agent, or Firm* — Purdue Research Foundation; Liang Zeng Yan

(57) ABSTRACT

This invention generally relates to a device for preparing and transferring a monolayer or thin film. In particular this present invention is a device for preparing and transferring a monolayer or thin film to a substrate using an improved version of the Langmuir-Schaefer technique, which incorporates in situ thermal control, for instance to heat the supporting substrate before and/or during the transfer process.

20 Claims, 2 Drawing Sheets

(56) References Cited

OTHER PUBLICATIONS

MacLeod, J., et al., "Molecular Self-Assembly on Graphene", Small 2014, 10, pp. 1038-1049.
Mali, K., et al., "Nanostructuring Graphene for Controlled and Reproducible Functionalization", Nanoscale 2015, 7, pp. 1566-1585.
Gatti, R., et al., "Substrate, Molecular Structure, and Solvent Effects in 2D Self-Assembly Via Hydrogen and Halogen Bonding", J. Phys. Chem. C 2014, 118, pp. 25505-25516.
Yang, Y., et al., "Shape Amphiphiles in 2-D: Assembly of 1-D Stripes and Control of Their Surface Density", J. Phys. Chem. B 2015, 119, pp. 7740-7748.
Kuila, T., et al., "Chemical Functionalization of Graphene and Its Applications", Prog. Mater. Sci. 2012, 57, pp. 1061-1105.
Bang, J., et al., "Sitting Phases of Polymerizable Amphiphiles for Controlled Functionalization of Layered Materials", J. Am. Chem. Soc. 2016, 138, pp. 4448-4457.
Choong, S., et al., "Sitting Phase Monolayers of Polymerizable Amphiphiles Create Molecular-Scale Wetting Anisotropy on Layered Materials", ACS Appl. Mater. Interf. 2017, 2017, 9, pp. 19326-19334.
Okawa, Y., et al., "Controlled Chain Polymerisation and Chemical Soldering for Single-Molecule Electronics", Nanoscale 2012, 4, pp. 3013-3028.
Donhauser, Z., et al, "Control of Alkanethiolate Monolayer Structure Using Vapor-Phase Annealing", J. Am. Chem. Soc. 2003, 125, pp. 11462-11463.

\* cited by examiner

DEVICE FOR IN SITU THERMAL CONTROL AND TRANSFER OF A MONOLAYER OR THIN FILM

CROSS REFERENCE TO RELATED APPLICATIONS

This present patent application relates to and claims the priority benefit of U.S. Provisional Application Ser. No. 62/533,689, filed Jul. 18, 2017, the content of which is hereby incorporated herein by reference in its entirety.

GOVERNMENT RIGHTS

This invention was made with government support under grant No. CHE1555173, awarded by the National Science Foundation. The United States government has certain rights in the invention.

FIELD OF THE INVENTION

This invention generally relates to a device for preparing and transferring a monolayer or thin film. In particular this present invention is a device for preparing and transferring a monolayer or thin film to a substrate using an improved version of the Langmuir-Schaefer technique, which incorporates in situ thermal control and an elevated temperature in the transfer process.

BACKGROUND AND BRIEF SUMMARY

This section introduces aspects that may help facilitate a better understanding of the disclosure. Accordingly, these statements are to be read in this light and are not to be understood as admissions about what is or is not prior art.

Controlling surface functionalization of 2D materials has emerged as a major requirement in materials chemistry (Mann, J A et al., *J. Phys. Chem. Lett.* 2013, 4, 2649-2657; MacLeod, J M., et al., *Small* 2014, 10, 1038-1049). To preserve electronic conjugation within the 2D layer, substrates are often functionalized noncovalently (De Feyter, S. et al., *Chem. Soc. Rev.* 2003, 32, 139-150; Mali, K S, et al., *Nanoscale* 2015, 7, 1566-1585; Okawa, Y et al., *Nature* 2001, 409, 683-684); ligand-substrate interaction can then be used to control electronic structure (Georgakilas, V et al., *Chem. Rev.* 2012, 112, 6156-6214; Kuila, T, et al, *Prog. Mater. Sci.* 2012, 57, 1061-1105).

However, utilization of noncovalent monolayers in scalable industrial processes such as solution- and spray-coating elevates the importance of creating robust, solvent-stable films (Bang, J J, et al, *J. Am. Chem. Soc.* 2016, 138, 4448-4457; Choong, S W, et al., *ACS Appl. Mater. Interfaces* 2017, 9(22), 19326-19334). A significant body of work in other types of monolayers has demonstrated that desorption of molecules occurs orders of magnitude more rapidly at defects (Doudevski, I. et al, *Langmuir* 2000, 16, 9381-9384; Love, J C, et al., *Chem. Rev.* 2005, 105, 1103-1169), suggesting the importance of creating large ordered domains. Here, we report a process for increasing ordered domain areas substantially (over an order of magnitude for the molecules utilized here), using a modified Langmuir-Schaefer (LS) technique that enables in situ thermal control during film preparation. We find that monolayers of polymerized diynoic phospholipids prepared in this way are stable toward vigorous washing with both polar and nonpolar solvents (including water, ethanol, tetrahydrofuran (THF), and toluene), suggesting utility in applications that require solution processing.

Classical Langmuir-Schaefer (LS) transfer protocols have been utilized since the 1930s to transfer standing phases of amphiphiles to solid substrates (Langmuir, I, et al., *J. Am. Chem. Soc.* 1938, 60, 1351-1360). In this process, a monolayer of amphiphiles is pre-assembled on an aqueous subphase, and a (usually hydrophobic) substrate is lowered onto the molecular film and withdrawn, transferring molecules to the substrate. Although conventionally utilized to transfer standing phase films (Castellana, E T, et al., *Surf Sci. Rep.* 2006, 61, 429-444), LS transfer can also be used to convert standing monolayers on the aqueous subphase into lying-down phases on 2D materials such as highly ordered pyrolytic graphite (HOPG) (Okawa, Y, et al, *J. Chem. Phys.* 2001, 115, 2317-2322; Giridharagopal, R. et al., *J. Phys. Chem. C* 2007, 111, 6161-6166).

In classic LS transfer of standing phases, transferred molecules retain their original ordering; thus, transferring from tightly packed source films minimizes defects (Ninks, B P, *Adv. Colloid Interface Sci.* 1991, 34, 343-432; Honig, E P, et al., *J. Colloid Interface Sci.* 1973, 45, 92-102). In contrast, in Langmuir-Schaefer transfer involving conversion of standing phases to lying-down phases, each molecule must rotate up to 90° from its initial orientation in the source film to form the horizontally-oriented monolayer (FIG. 1, top left). A LS transfer technique involving conversion is a convenient method to prepare surfaces for scanning probe studies of noncovalent monolayers (e.g. diynoic acids) (Okawa, Y, et al, *J. Chem. Phys.* 2001, 115, 2317-2322; Giridharagopal, R. et al., *J. Phys. Chem. C* 2007, 111, 6161-6166; Okawa, Y. et al., *Nanoscale* 2012, 4, 3013-3028), in which typical domain edge lengths are on the order of ~100 nm. If adequate control were developed over the conversion process, it could represent a useful means of controlling film structure over length scales from nm to cm.

However, LS transfer involving conversion of standing phases to lying-down phases is both mechanistically more complex and less well understood than classic LS transfer of standing phases; our experience and that of others (Grim, P C M, et al, *Angew. Chem. Int. Ed.* 1997, 36, 2601-2603) suggests that transfer efficiency and ordering of lying-down phases created using this technique can be quite variable. Further improvement of LS technique is needed to handle transfer involving conversion of standing phases to lying-down phases.

In this present invention, a device disclosed herein is designed to facilitate the preparation and transfer of a monolayer or thin film using an improved version of the Langmuir-Schaefer technique, which incorporates in situ thermal control in the transfer process.

SUMMARY OF THE INVENTION

This invention generally relates to a device for preparing and transferring a monolayer or a thin film. In particular this present invention is a device for preparing and transferring a monolayer or thin film to a substrate using an improved version of the Langmuir-Schaefer technique, which incorporates in situ thermal control during the transfer process.

BRIEF DESCRIPTION OF THE DRAWINGS

Embodiments of the present disclosure will now be described by way of example in greater detail with reference to the attached Figs., in which.

DETAILED DESCRIPTION

Figure 1:
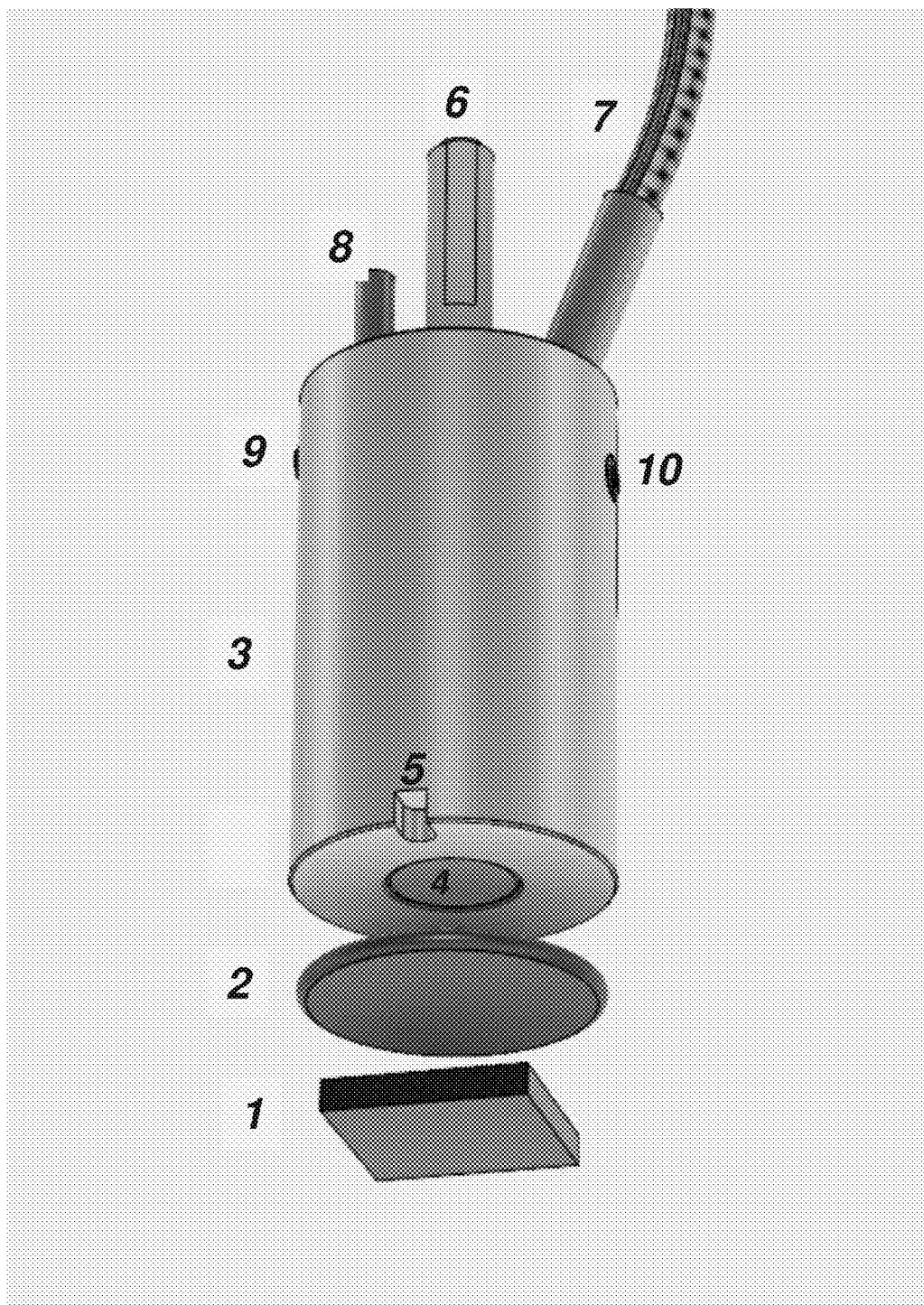
FIG. 1 depicts essential elements of the device disclosed herein.
Figure 2:
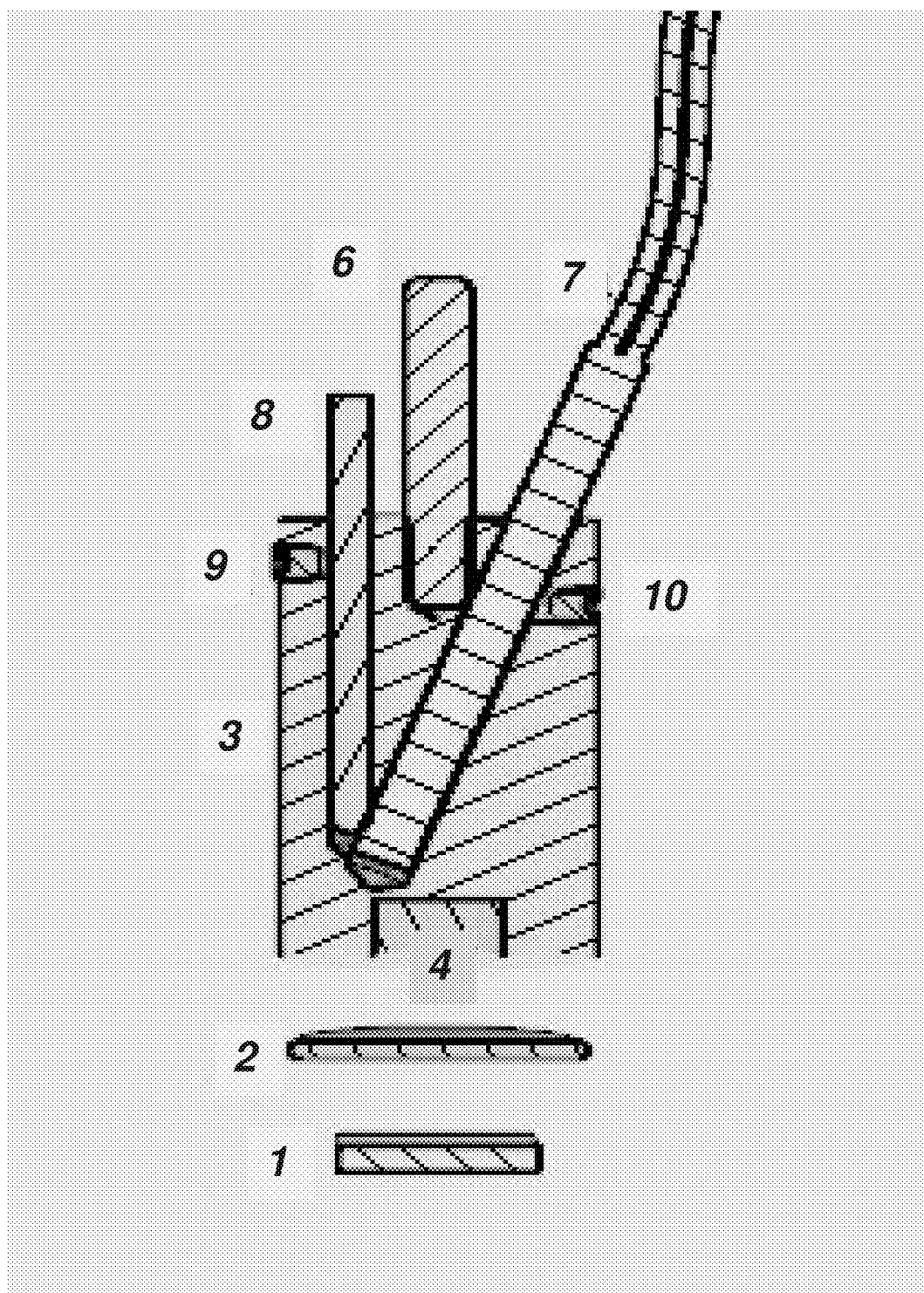
FIG. 2 depicts a cross-sectional view of the ten essential elements of the device disclosed herein: (1) Supporting substrate; (2) Sample disc; (4) Magnet; (8) Thermocouple; (6) Pin for handling; (7) Cartridge heater; (9) and (10) Set screws for holding heater and thermocouple in place in the heater body.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 20%, within 10%, within 5%, or within 1% of a stated value or of a stated limit of a range.

In the present disclosure the term "substantially" can allow for a degree of variability in a value or range, for example, within 80%, within 90%, within 95%, or within 99% of a stated value or of a stated limit of a range.

A layered, or two-dimensional (2D) material generally has a layer thickness between one atomic layer and a few nm. Even though the existence of two-dimensional materials have been theorized since the 1940's (Wallace, P. R. The band theory of graphite. *Phys. Rev.* 71, 622-634 (1947)), it was not until 2004 that it was shown that these materials can be stable as freestanding sheets, by the isolation of individual graphene sheets (Novoselov, K. S. et al., *Science* 306, 666-669 (2004)). Layers may be stacked to form macroscopic materials; for instance, highly oriented pyrolytic graphite (HOPG) consists of stacks of graphene layers.

This invention generally relates to a device for preparing and transferring a monolayer or thin film. In particular this present invention is a device for preparing and transferring a monolayer or thin film to a substrate using an improved version of the Langmuir-Schaefer technique, which incorporates in situ thermal control in the transfer process.

In some illustrative embodiments, this invention relates to a device for transferring a monolayer or a thin film comprising
  a) a magnetic sample disc; and
  b) a heater body encompassing
    i. a cartridge heater operatively connected to a temperature controller for heating and temperature control;
    ii. a thermocouple operatively connected to a temperature controller for heating and temperature control; and
    iii. a magnet positioned at one end of the body to provide sufficient force to pick up the sample disc without physically touching it.

In some other embodiments, the device disclosed herein for transferring a monolayer or a thin film further comprises a supporting substrate connected to the magnetic sample disc by thermally conductive tape or epoxy.

In some other embodiments, the present invention relates to a device disclosed herein for transferring a monolayer or a thin film, wherein the supporting substrate is a layered material.

In some other embodiments, the present invention relates to a device disclosed herein for transferring a monolayer or a thin film, wherein the supporting substrate is graphene, highly ordered pyrolytic graphite (HOPG), $MoS_2$, or $WS_2$.

In some other embodiments, the present invention relates to a device disclosed herein for transferring a monolayer or a thin film, wherein the heater body further comprises a groove at the bottom edge of the body to facilitate gripping the disc for ease of loading and unloading of the supporting substrate.

In some other embodiments, the present invention relates to a device disclosed herein for transferring a monolayer or a thin film, wherein the heater body further comprises a pin to facilitate operational handling.

In some embodiments, the present invention relates to a device disclosed herein for transferring a monolayer or a thin film, wherein the heating and temperature control through said thermocouple is operative at an elevated temperature from about 25° C. to about 250° C., which is limited only by the physical/chemical stability of said monolayer or thin film and the medium used for the preparation of said monolayer or thin film.

In some other embodiments, the present invention relates to a device disclosed herein for transferring a monolayer or a thin film, wherein the heating and temperature control through said thermocouple is operative in the range from about 30° C. to about 90° C., wherein the thin film or monolayer is prepared at the interface of air and an aqueous medium.

In some embodiments, the present invention relates to a device disclosed herein for transferring a monolayer or a thin film, wherein heating may be either pre-heating of the supporting substrate or continuous heating with a constant temperature throughout the transferring process.

In some other illustrative embodiments, the present invention relates to a method for transferring a monolayer or a thin film comprising the steps of
  a) preparing a monolayer or a thin film; and
  b) using a device comprising
    1) a magnetic sample disc; and
    2) a heater body encompassing
      i. a cartridge heater operatively connected to a temperature controller for heating and temperature control;
      ii. a thermocouple operatively connected to a temperature controller for heating and temperature control; and
      iii. a magnet positioned at one end of the body to provide sufficient force for picking up said sample disc without physically touching it.

In some embodiments, the present invention relates to a method for transferring a monolayer or a thin film as disclosed herein, wherein said device further comprises a supporting substrate connected to the magnetic sample disc by thermally conductive tape or epoxy.

In some embodiments, the present invention relates to a method for transferring a monolayer or a thin film as disclosed herein, wherein said device further comprises a supporting substrate connected to the magnetic sample disc by thermally conductive tape or epoxy, wherein said supporting substrate is a layered material.

In some embodiments, the present invention relates to a method for transferring a monolayer or a thin film as disclosed herein, wherein said device further comprises a supporting substrate connected to the magnetic sample disc by thermally conductive tape or epoxy, wherein said supporting substrate is a layered material, wherein said layered material is graphene, highly ordered pyrolytic graphite (HOPG), $MoS_2$, or $WS_2$.

In some embodiments, the present invention relates to a method for transferring a monolayer or a thin film as disclosed herein, wherein said heater body further comprises a groove at the bottom edge of the body to facilitate gripping the disc for loading and unloading of the supporting substrate.

In some embodiments, the present invention relates to a method for transferring a monolayer or a thin film as disclosed herein, wherein said heater body further comprises a pin to facilitate operational handling.

In some embodiments, the present invention relates to a method disclosed herein for transferring a monolayer or a thin film, wherein the heating and temperature control through said thermocouple is operative at an elevated temperature ranging from about 25° C. to about 250° C., which is limited only by the physical/chemical stability of said monolayer or thin film and the medium used for the preparation of said monolayer or thin film.

In some other embodiments, the present invention relates to a method disclosed herein for transferring a monolayer or a thin film, wherein the heating and temperature control through said thermocouple is operative in the range from about 30° C. to about 90° C., wherein the thin film or monolayer is prepared at the interface of air and an aqueous medium.

In some embodiments, the present invention relates to a method for transferring a monolayer or a thin film as disclosed herein, wherein heating is provided by means of either pre-heating of the supporting substrate or continuous heating at a constant temperature throughout the transfer process.

In some embodiments, the present invention relates to a device for transferring a monolayer or a thin film comprising
  a) a magnetic sample disc;
  b) a cartridge heater body operatively connected to a temperature controller for heating and temperature control;
  c) a thermocouple operatively connected to a temperature controller for heating and temperature control;
  d) a magnet positioned at one end of the cartridge heater body to provide sufficient force for picking up said sample disc without physically touching it; and
  e) a supporting substrate connected to the magnetic sample disc by thermally conductive tape or epoxy.

In some embodiments, the present invention relates to a device disclosed herein for transferring a monolayer or a thin film, wherein said cartridge heater body further comprises a groove at the bottom edge of the body to facilitate gripping the disc for loading and unloading of the supporting substrate.

In some embodiments, the present invention relates to a device for transferring a monolayer or a thin film as disclosed herein, wherein the cartridge heater body further comprises a pin to facilitate operational handling.

In some embodiments, the present invention relates to a device for transferring a monolayer or a thin film as disclosed herein, wherein the heating and temperature control through said thermocouple is operative in the range from about 25° C. to about 250° C.

In some embodiments, the present invention relates to a device for transferring a monolayer or a thin film as disclosed herein, wherein the heating and temperature control through said thermocouple is operative in the range from about 30° C. to about 90° C., wherein the thin film or monolayer is prepared at the interface of air and an aqueous medium.

The following Examples are intended to illustrate the above invention and should not be construed as to narrow its scope. One skilled in the art will readily recognize that the Examples suggest many other ways in which the invention could be practiced. It should be understood that numerous variations and modifications may be made while remaining within the scope of the invention.

FIG. 1 depicts the essential elements of the device disclosed herein. The supporting substrate (1) is a 1 cm×1 cm×1 mm piece of graphite, and is affixed to sample disc (2), using a thermally conductive tape or epoxy. The sample disc is a 12 mm magnetic stainless steel disc, of the type sold commercially for handling of atomic force microscopy (AFM) samples.

The steel sample disc (2) is loaded onto a machined aluminum cylinder that functions as the heater body (3). The sample disc and the supporting substrate are held in place using a magnet (4). The magnet (4) is affixed in a shallow machined recess in the aluminum cylinder heater body (3). This loading geometry is used to improve contact between the sample disc and the aluminum cylinder heater body (3), which is more thermally conductive than the magnet (4). The magnet is sufficiently strong to prevent the sample disc and the supporting substrate from falling off when suspended against gravity.

A groove (5) is machined in the bottom edge of the heater body (notch shown at front of cylinder between 3 & 4) to facilitate gripping the sample disc with tweezers for loading and unloading of the supporting substrate (1).

The heater body (3) is affixed to the dipper arm (not shown) on a commercial Langmuir trough, using a pin (6) made from a thermally insulative temperature resistant plastic (such as polyether ether ketone, PEEK). The pin (6) is firmly attached to the heater body (3), which may be achieved by screwing the pin into a threaded hole machined in the top of the heater body.

The heater body (3) is heated by a 24 watt 120V AC cartridge heater, 1¼" long and ⅛" in diameter (7). The heater is affixed to the aluminum body (3) at an angle to cause the center of heating to align through the center of the body. It (7) is secured with a set screw (10). The heater body is controlled by a PID controller (not shown) via a thermocouple (8) also embedded in the heater body and secured with a setscrew (9) (wires not drawn).

The entire assembly is normally over-wrapped with an aerogel insulation blanket, which in turn is overwrapped in an electrical insulation and sealing tape (not shown). These last items are for user safety and ease of handling the cartridge while hot.

A Proportional Integral Derivative (PID) controller is a commercially-available relay-driven heater control that adjusts power to the heater to match the core aluminum cylinder temperature to a desired set point, using the thermocouple as feedback for the heater relay.

Those skilled in the art will recognize that numerous modifications can be made to the specific implementations described above. The implementations should not be limited to the particular limitations described. Other implementations may be possible.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

It is intended that the scope of the present methods and apparatuses be defined by the following claims. However, it must be understood that this disclosure may be practiced otherwise than is specifically explained and illustrated without departing from its spirit or scope. It should be understood by those skilled in the art that various alternatives to the embodiments described herein may be employed in practicing the claims without departing from the spirit and scope as defined in the following claims.

What is claimed is:

1. A device for transferring a monolayer or a thin film comprising
   a) a magnetic sample disc; and
   b) a heater body encompassing
      i. a cartridge heater operatively connected to a temperature controller for heating and temperature control; and
      ii. a thermocouple operatively connected to the temperature controller for heating and temperature control; and
   c) a magnet positioned at one end of the heater body to provide sufficient force for picking up said magnetic sample disc without physically touching the magnetic sample disc.

2. The device of claim 1 further comprising a supporting substrate connected to the magnetic sample disc by thermally conductive tape or epoxy.

3. The device of claim 2, wherein the supporting substrate is a layered material.

4. The device of claim 3, wherein said layered material is graphene, highly ordered pyrolytic graphite (HOPG), $MoS_2$, or $WS_2$.

5. The device of claim 1, wherein the heater body further comprises a groove at the bottom edge of the body to facilitate gripping the magnetic sample disc for loading and unloading of the supporting substrate.

6. The device of claim 1, wherein the heater body further comprises a pin to facilitate operational handling.

7. The device of claim 1, wherein the heating and temperature control through said thermocouple is operative at an elevated temperature in a range from about 25° C. to about 250° C.

8. The device of claim 1, wherein heating is provided by way of either pre-heating of the supporting substrate or continuous heating with a constant temperature throughout the transferring process.

9. A method for transferring a monolayer or a thin film comprising the steps of
   a) preparing a monolayer or a thin film; and
   b) using a device comprising
      1) a magnetic sample disc; and
      2) a heater body encompassing
         i. a cartridge heater operatively connected to a temperature controller for heating and temperature control; and
         ii. a thermocouple operatively connected to the temperature controller for heating and temperature control; and
      3) a magnet positioned at one end of the heater body to provide sufficient force for picking up said magnetic sample disc without physically touching the magnetic sample disc.

10. The method of claim 9, wherein said device further comprises a supporting substrate connected to the magnetic sample disc by thermally conductive tape or epoxy.

11. The method of claim 10, wherein the supporting substrate is a layered material.

12. The method of claim 11, wherein said layered material is graphene, highly ordered pyrolytic graphite (HOPG), $MoS_2$, or $WS_2$.

13. The method of claim 9, wherein said heater body further comprises a groove at the bottom edge of the heater body to facilitate gripping the magnetic sample disc for loading and unloading of the supporting substrate.

14. The method of claim 9, wherein said heater body further comprises a pin to facilitate operational handling.

15. The method of claim 9, wherein said heating and temperature control through said thermocouple is operative at an elevated temperature in the range from about 25° C. to about 250° C.

16. The method of claim 9, wherein heating is provided by way of either pre-heating of the supporting substrate or continuous heating with a constant temperature throughout the transferring process.

17. A device for transferring a monolayer or a thin film comprising
   a) a magnetic sample disc;
   b) a cartridge heater body operatively connected to a temperature controller for heating and temperature control;
   c) a thermocouple operatively connected to the temperature controller for heating and temperature control;
   d) a magnet positioned at one end of the cartridge heater body to provide sufficient force for picking up said magnetic sample disc without physically touching the magnetic sample disc; and
   e) a supporting substrate connected to the magnetic sample disc by thermally conductive tape or epoxy.

18. The device of claim 17, wherein the cartridge heater body further comprises a groove at the bottom edge of the body to facilitate gripping the magnetic sample disc for loading and unloading of the supporting substrate.

19. The device of claim 17, wherein the cartridge heater body further comprises a pin to facilitate operational handling.

20. The device of claim 17, wherein the heating and temperature control through said thermocouple is operative at an elevated temperature in the range from about 25° C. to about 250° C.

* * * * *